(12) United States Patent
Nishimura

(10) Patent No.: US 7,666,001 B2
(45) Date of Patent: Feb. 23, 2010

(54) CIRCUIT CONNECTION STRUCTURE AND PRINTED CIRCUIT BOARD

(75) Inventor: Shinichi Nishimura, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/564,332

(22) Filed: Nov. 29, 2006

(65) Prior Publication Data
US 2007/0123074 A1 May 31, 2007

(30) Foreign Application Priority Data
Nov. 29, 2005 (JP) ............... 2005-343050

(51) Int. Cl.
*H01R 12/00* (2006.01)
(52) U.S. Cl. ..................................... 439/67
(58) Field of Classification Search .............. 439/67, 439/924.1, 620.24, 620.01, 620.15, 620.16, 439/495; 361/816, 800
See application file for complete search history.

(56) References Cited

U.S. PATENT DOCUMENTS

| | | | |
|---|---|---|---|
| 5,669,775 A * | 9/1997 | Campbell et al. ............. | 439/77 |
| 5,880,590 A * | 3/1999 | Desai et al. .................. | 324/757 |
| 6,028,775 A * | 2/2000 | Batten et al. ................. | 361/816 |
| 6,097,613 A * | 8/2000 | Batten et al. ................. | 361/816 |
| 6,898,852 B2 * | 5/2005 | Abazarnia et al. ............. | 29/857 |
| 6,907,658 B2 * | 6/2005 | Li ............................... | 29/832 |
| 2002/0106914 A1 * | 8/2002 | Belanger et al. .............. | 439/67 |
| 2006/0050491 A1 * | 3/2006 | Hayashi et al. .............. | 361/760 |

FOREIGN PATENT DOCUMENTS

JP   H09-289064 A   11/1997

* cited by examiner

*Primary Examiner*—T C Patel
*Assistant Examiner*—Vladimir Imas
(74) *Attorney, Agent, or Firm*—Fitzpatrick, Cella, Harper & Scinto

(57) ABSTRACT

To prevent damage to equipment due to the oblique insertion of a fat cable, a capacitor-connection line having a capacitive circuit element is disposed adjacent to a power supply line of a printed circuit board and connected to a ground of the printed circuit board. When a flat cable is obliquely inserted, the capacitor-connection line which comes into erroneous contact with the power supply line works as high impedance in the case of a direct current, and the current does not flow. Damage generated when a flat cable is obliquely inserted into a connector of a printed circuit board is prevented in this manner.

2 Claims, 4 Drawing Sheets

CIRCUIT CONNECTION STRUCTURE AND PRINTED CIRCUIT BOARD

BACKGROUND OF THE INVENTION

1. Field of the Invention

The present invention relates to a circuit connection structure which connects a flat cable to a printed circuit board, and a printed circuit board.

2. Description of the Related Art

Usually, a flat cable is connected to a printed circuit board through a connector. However, because a connector has usually a plug-in allowance of a prescribed amount, there are cases where a worker who performs part replacement erroneously inserts a flat cable obliquely to a connector as shown in FIG. 7. In FIG. 7, reference numeral 101 denotes a printed circuit board, reference numeral 110 denotes a printed wiring board, reference numeral 102 denotes a flat cable, and reference numeral 103 denotes a connector formed on the printed wiring board 110. Reference numerals 111 and 121 denote power supply lines and reference numerals 113 and 122 denote ground lines.

Recent years have seen miniature designs and thin designs of electronic equipment and, for this reason, the terminal-to-terminal gap of a flexible flat cable (FFC) has provided a narrow pitch of 0.5 mm or less. Therefore, if the flat cable 102 is obliquely inserted, the adjacent lines 121 and 122 formed in the flat cable 102 come into erroneous contact with each other through a contact 131 of the connector 103, whereby there is a fear that electronic equipment may be damaged.

Hence as disclosed by Japanese Patent Application Laid-Open No. H09-289064, there has been considered a method of detecting insertions by using a flat cable having a special terminal construction in which each terminal length at both ends is short. Furthermore, as shown in FIG. 8, means for preventing erroneous contact between lines may sometimes be taken by setting a gap between a power supply line 221 and an adjacent line 222 in a flat cable 202 at not less than twice a usual gap as simpler and inexpensive means. According to this method, it is possible to prevent damage to equipment at low cost.

However, the method disclosed by Japanese Patent Application Laid-Open No. H09-289064 requires an additional step of shape addition for a usual flat cable. Furthermore, because it is necessary to provide a circuit for detecting oblique insertions, the cost rises greatly.

The method shown in FIG. 8 had the problem that if the spacing from a ground line adjacent to the power supply line widens, the value of radiation noise becomes high. That is, if a high-frequency noise current generated in a digital circuit flows through a flat cable, the flat cable works as an unintended antenna and radiation noise is generated. The value of radiation noise is proportional to a high-frequency noise current and the size of a loop area of a return channel of the high-frequency noise current. A high-frequency noise current which flows in the power supply line uses the adjacent ground line having a low impedance as its return channel. The narrower the gap of the power supply line to the return channel, the smaller the loop area of a high-frequency noise current and, therefore, the value of radiation noise becomes smaller. Conversely, the wider the gap between the power supply line and the return channel, the larger the loop area of a high-frequency noise current, and hence the value of radiation noise also becomes larger.

SUMMARY OF THE INVENTION

The present invention has been made in view of the above-described unsolved problems of the conventional art and, the object of the invention is to provide a circuit connection structure and a printed circuit board which can effectively avoid damage to electronic equipment when a flat cable is obliquely inserted into a connector.

To achieve the above object, a circuit connection structure of the present invention provides a circuit connection structure which electrically connects a flat cable having a power supply line to a printed circuit board, in which a line adjacent to the power supply line of the flat cable is connected to a ground of the printed circuit board through a capacitive circuit element mounted on the printed circuit board.

Further features of the present invention will become apparent from the following description of exemplary embodiments with reference to the attached drawings.

DESCRIPTION OF THE EMBODIMENTS

Figure 1:
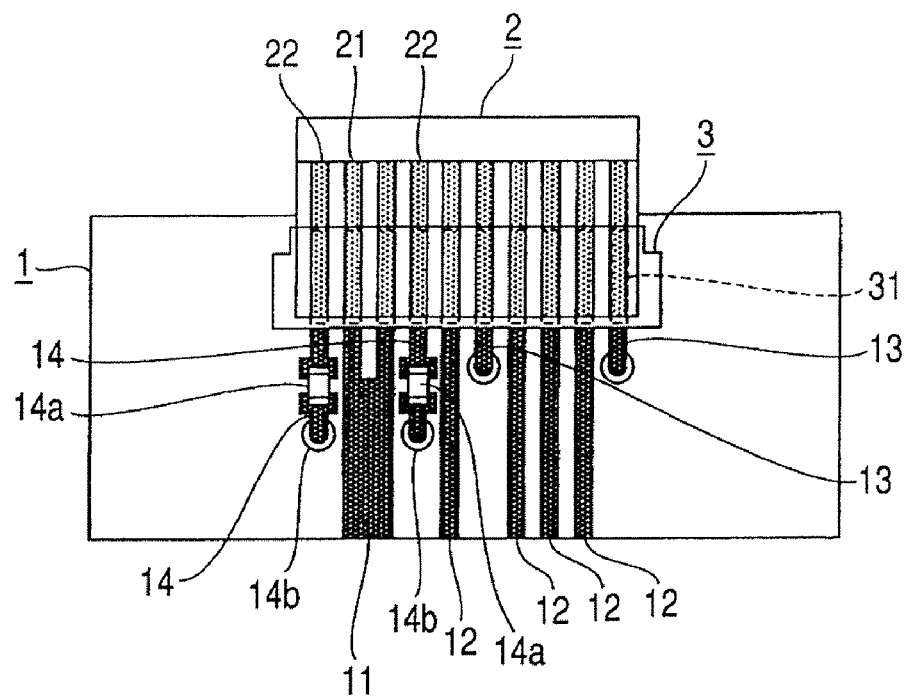
FIG. 1 is a plan view which shows a printed circuit board in Embodiment 1 of the present invention.

In FIG. 1, reference numeral 1 denotes a printed circuit board, reference numeral 10 denotes a printed wiring board, reference numeral 2 denotes a flat cable, and reference numeral 3 denotes a connector formed on the printed wiring board 10. Reference numerals 11 and 21 denote power supply lines, and reference numerals 13 and 22 denote ground lines. Reference numeral 12 denotes a signal line. On both sides of the power supply line 11, there are disposed capacitor-connection lines 14 each having a capacitive circuit element 14a, and the power supply line 11 is connected, through a via 14b, to a ground line or a ground layer within the printed circuit board 1. When the flat cable 2 is inserted into the connector 3, the lines 21 and 22 of the flat cable are connected to the lines 11 to 14 of the printed circuit board 1 through a contact 31 of the connector 3, respectively, as shown in FIG. 1. At this time, the line 22 adjacent to the power supply line 21 of the flat cable 2 is connected to the capacitor-connection line 14 of the printed circuit board 1.

Figure 2:
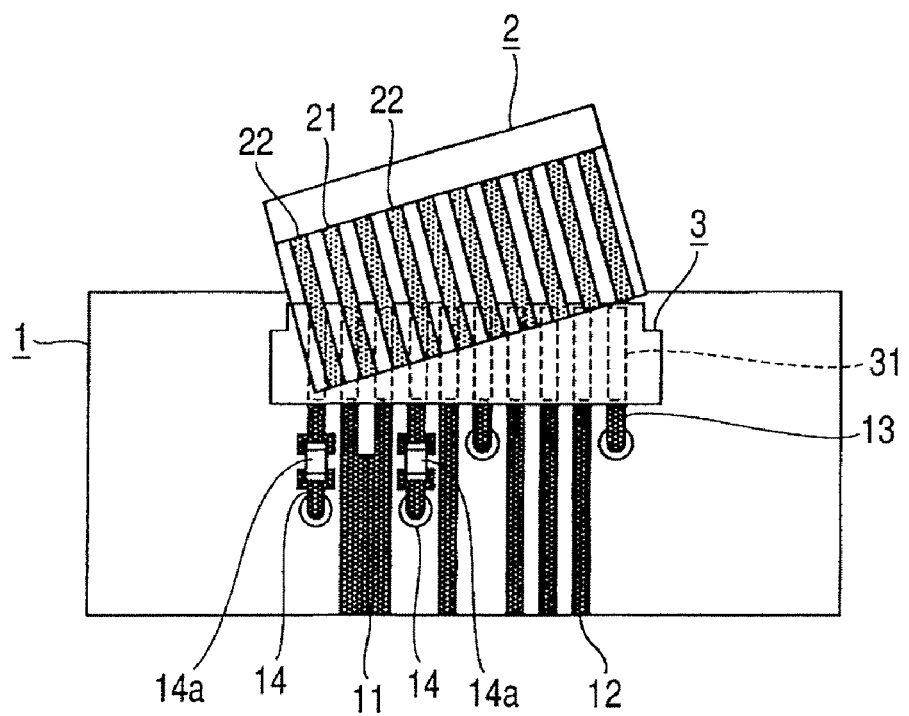
FIG. 2 is a plan view which shows a printed circuit board in Embodiment 1 of the present invention.

As shown in FIG. 2, when the flat cable 2 is obliquely inserted into the connector, the capacitive circuit element 14a of the capacitor-connection line 14 which comes into erroneous contact with the power supply line 21 corresponding to the power supply line 11 of the printed circuit board 1 obtains a high impedance in the case of a direct current. For this reason, the direct current does not flow. As a result, it is possible to prevent damage to electronic equipment.

The line 22 adjacent to the power supply line 21 of the flat cable 2 works as a return channel in close proximity to a noise component current which propagates in the power supply line 21. Therefore, it is possible to suppress a radiation noise from the flat cable 2.

A chip ceramic capacitor of 0.1 μF or more and 1000 μF or less is desirable as the capacitive circuit element 14a. At 30 MHz to 1 GHz, which represent the radiation noise measurement zone, the line 22 adjacent to the power supply line 21 of the flat cable 2 is connected to the ground of the printed circuit board 1 at a low impedance and hence works as a return channel for a noise component current which propagates in the power supply line 21. As a result, it is possible to effectively suppress a radiation noise form the flat cable 2.

In addition to the connection of the capacitor-connection line of the printed circuit board to the ground of the printed circuit board, the line adjacent to the capacitor-connection line may be a ground line.

With this construction, at 30 MHz to 1 GHz, which represent the radiation noise measurement zone, the line adjacent to the power supply line of the flat cable woks as a return channel for a noise component current which propagates in the power supply line and, moreover, the adjacent ground line also similarly works as a return channel. As a result, the power supply line has a more stable return channel and, therefore, it is possible to more effectively suppress the radiation noise from the flat cable.

Embodiment 1

FIGS. 1 to 4 are explanatory diagrams for Embodiment 1. FIG. 1 shows the state of the printed circuit board 1 connected to the flat cable 2 by the connector 3. The lines 22 adjacent to and on both sides of the power supply line 21 of the flat cable 2 are connected to capacitive circuit elements 14a on the capacitor-connection lines 14 adjacent to the power supply line 11 of the printed circuit board 1 through a contact 31 of the connector 3, respectively. A terminal of a capacitive circuit element 14a on the opposite side is connected through a via 14b to a ground line or a ground layer (not shown) within the printed circuit board 1.

Figure 8:
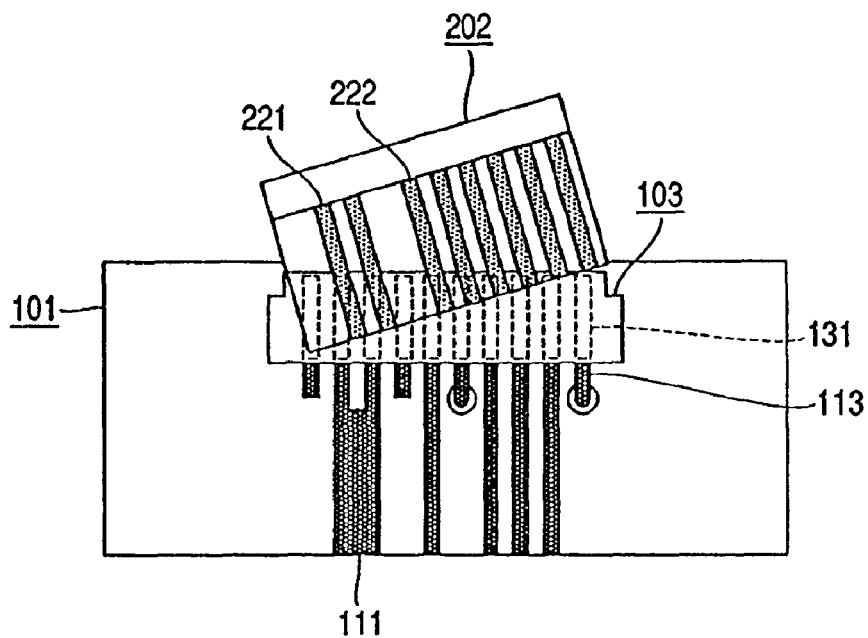
FIG. 8 is a plan view which shows a printed circuit board in a conventional example of the prior art.

In FIG. 1, the line 22 connected to the capacitive circuit element 14a functions as a return channel of a noise current for a high-frequency noise current component flowing through the power supply line 21 of the flat cable 2. Therefore, because the positional relationship between the power supply line 21 and the return channel is in closer vicinity than in the conventional example of FIG. 8, it is possible to suppress radiation noise.

FIG. 2 shows the flat cable 2 which is obliquely inserted by mistake. In this case, although the power supply line 21 comes into erroneous contact with the line 22 through the contact 31 of the connector 3, the capacitor-connection line 14 on the printed circuit board 1 to which the line 22 is connected has the capacitive circuit element 14a and hence functions as high impedance for a direct current. For this reason, it is possible to prevent a direct current from flowing from the power supply line 21 to the ground of the printed circuit board 1 and therefore, it is possible to prevent damage to equipment.

Figure 3:
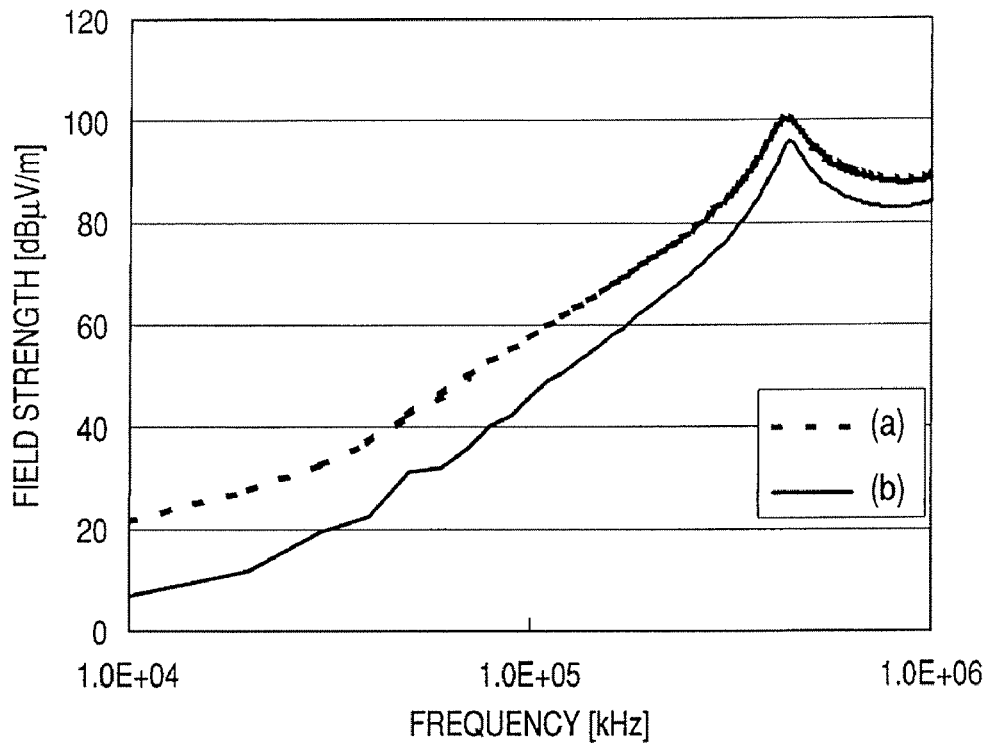
FIG. 3 is a graph which shows results of a simulated calculation of the electrical field strength of a printed circuit board in Embodiment 1 of the present invention.

FIG. 3 shows results of a confirmation of the above-described radiation noise suppressing effect by an electromagnetic field simulation. In this figure, the abscissa indicates the frequencies of 10 to 1000 MHz and the ordinate indicates an electrical field strength (radiation noise value) at a position 3 m distant therefrom. The curve a indicated by a broken line in FIG. 3 shows the calculation results of a flat cable having four lines (two power supply lines, one signal line and one ground line) each having a length of 100 mm as a conventional example of FIG. 8. Incidentally, the line widths are all 0.3 mm. For the line gaps, the gap of the two power supply lines was 0.2 mm, the gap between one power supply line and the signal line adjacent thereto was 0.9 mm, and the gap between this signal line and the ground line adjacent thereto was 0.2 mm. A noise source was set at one end of each of the two power supply lines and a resistance load was set at the other end. For the signal line, high resistance was given at both ends $(1 \times 10^{-6} \Omega)$.

The curve b indicated by a solid line in FIG. 3 shows calculation results of a flat cable having six lines (two power supply lines, one signal line and three ground line) each having a length of 100 mm in the device shown in FIG. 1. Incidentally, the line widths are all 0.3 mm and the line gaps are all 0.2 mm. In order from the left end of FIG. 1, a first capacitor-connection line, a first power supply line, a second power supply line, a second capacitor-connection line, a signal line and a ground line were arranged. An element such as a noise source was provided at the end portion of each of the lines. Capacitance is set for the capacitor-connection lines.

A comparison of the curves a and b in FIG. 3 reveals that the far electrical field strength (radiation noise value) of the curve b is lower by 10 dBμV/m or more. In this manner, it could be ascertained that the constitution according to Embodiment 1 has the radiation noise suppressing effect compared to the conventional example.

Figure 4:
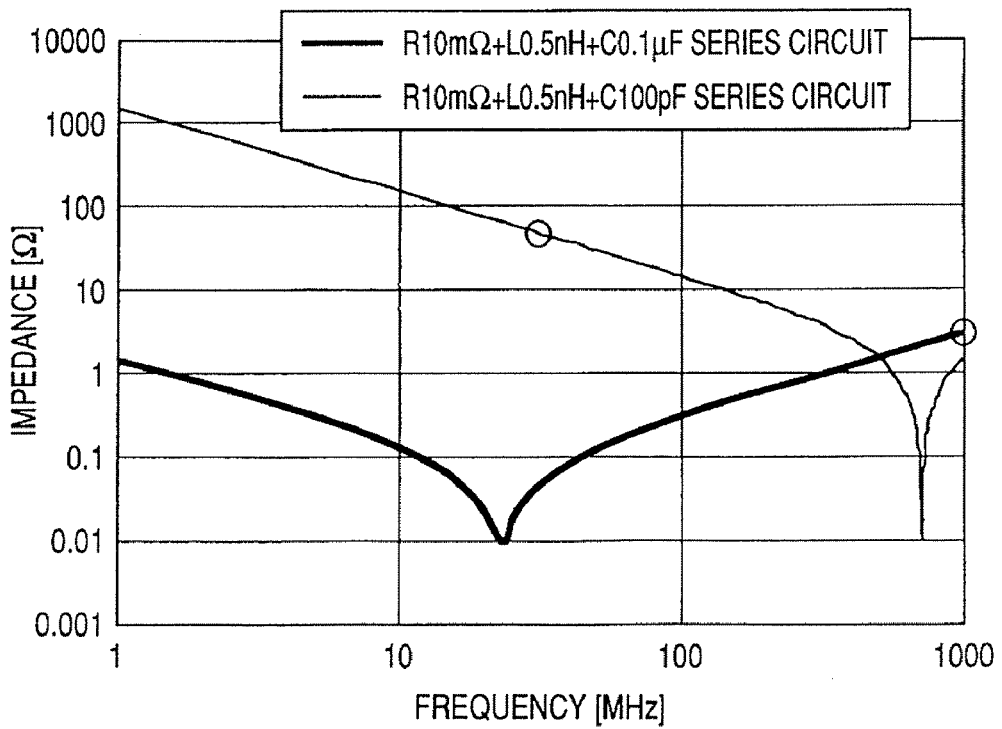
FIG. 4 is a graph which shows the impedance characteristics of a chip capacitor in Embodiment 1.

Furthermore, if the capacitive circuit element is a chip ceramic capacitor of 0.1 μF or more and 1000 μF or less, then at 30 MHz to 1000 MHz, which represent the radiation noise measurement zone, the impedance decreases to about 5Ω or less as shown in FIG. 4. This is a case where the value is compared with the value of about 55Ω of a capacitor of 100 pF. Because in this zone the line works as a return channel equal to that of the ground line, a further excellent radiation noise suppressing effect is obtained.

Embodiment 2

Figure 5:
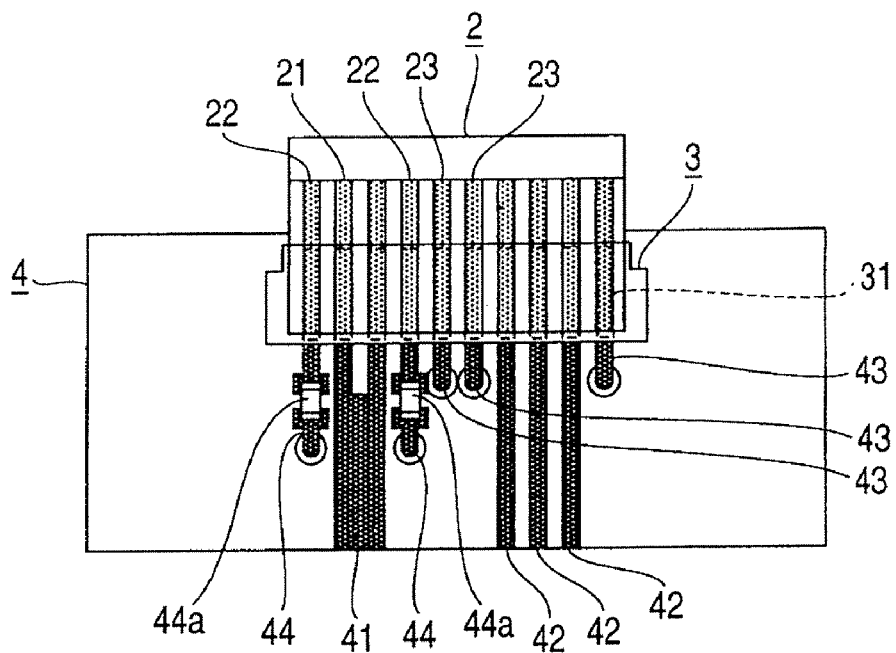
FIG. 5 is a plan view which shows a printed circuit board in Embodiment 2 of the present invention.
Figure 6:
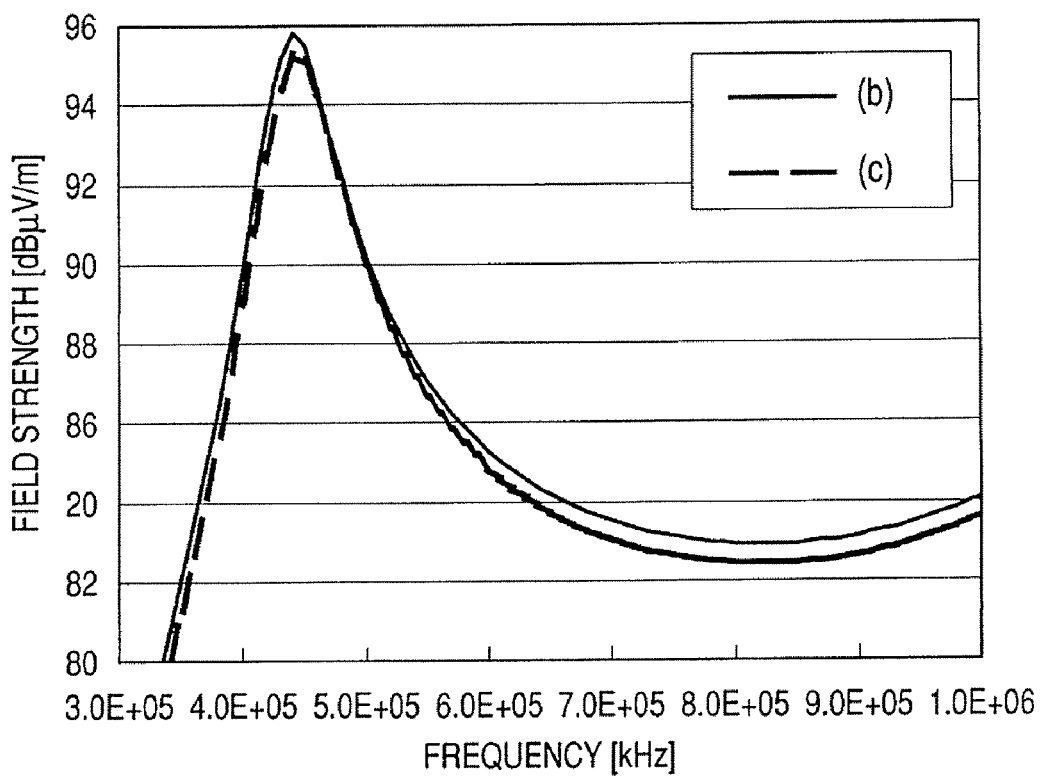
FIG. 6 is a graph which shows results of a simulated calculation of the electrical field strength of a printed circuit board in Embodiment 2 of the present invention.
Figure 7:
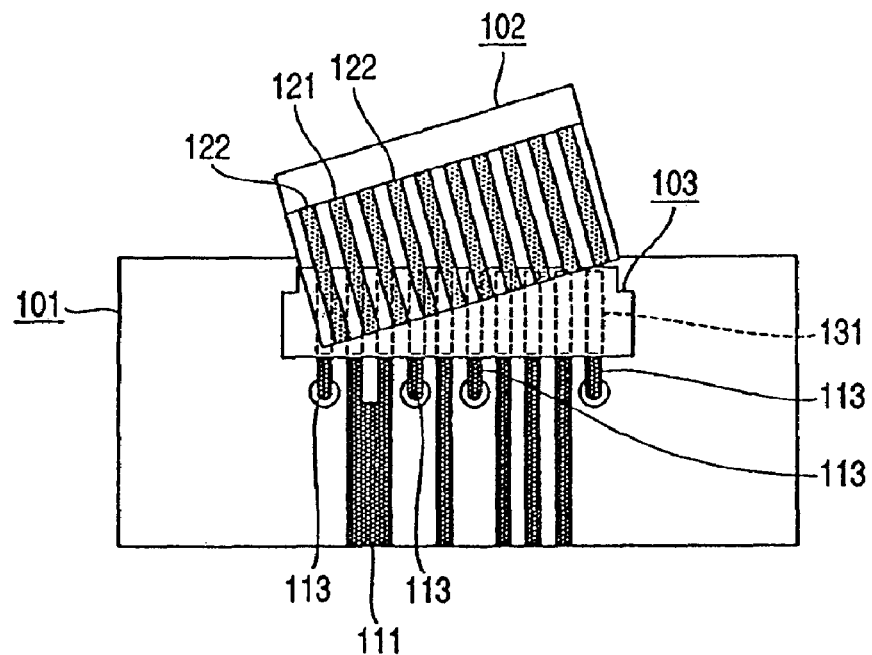
FIG. 7 is a plan view which shows a printed circuit board in a conventional example of the prior art.

FIGS. 5 and 6 are explanatory diagrams for Embodiment 2. In a construction in which a printed circuit board 4 and a flat cable 2 are connected by a connector 3, lines 22 adjacent to and on both sides of a power supply line 21 of the flat cable 2 are connected through a contact 31 of the connector 3 to capacitor-connection lines 44 on the printed circuit board 4, respectively. In the same manner as in Embodiment 1, a terminal of the capacitive circuit element 44a on the opposite side is connected, through the via, to a ground line or a ground layer (not shown) within the printed circuit board 4. A line 23 adjacent to the line 22 which is adjacent to the power supply line 21 of the flat cable 2 is connected through a via to a ground line 43 which is connected to a ground layer (not shown) within the printed circuit board 4. The flat cable 2 and the connector 3, which are the same as in Embodiment 1, are denoted by the same reference numerals and their descriptions are omitted. The effect in a case where the flexible wiring material 2 is obliquely inserted by mistake is also the same as in Embodiment 1 and hence its description is omitted.

In this embodiment, the line 22 through the capacitive circuit element 44a acts as a return channel of noise current for a high-frequency noise current component which flows on the power supply line 21 of the flat cable 2. Furthermore, the line 23 adjacent to the line 22 acts as a return channel because of a low-impedance ground line. As a result, the power supply line has a more stable return channel and, therefore, it is possible to more effectively suppress the radiation noise from the flat cable.

FIG. 6 shows results of a confirmation of the radiation noise suppressing effect by an electromagnetic field simulation. In this figure, the abscissa indicates the frequencies of 300 MHz to 1000 MHz and the ordinate indicates an electrical field strength (radiation noise value) at a position of 3 m distant therefrom. This figure shows the calculation results of the radiation noise of a flat cable having six lines (two power supply lines, one signal line and three ground lines) each having a length of 100 mm in the device of FIG. 5. Incidentally, the line widths are all 0.3 mm and the line gaps are all 0.2 mm. In order from the left end of FIG. 5, a first capacitor-connection line, a first power supply line, a second power supply line, a second capacitor-connection line, a first ground line and a second ground line were arranged. An element such as a noise source was provided at the end portion of each of the lines. The curve b indicated by a solid line of FIG. 6 shows the same data as the curve b of FIG. 3 and, therefore, the details of the calculation are the same as described above. What the details of the calculation are different from the curve c indicated by a broken line of FIG. 6 is that a ground line was provided in place of the signal line of Embodiment 1.

A comparison of the curves b and c in FIG. 6 reveals that the far electrical field strength (radiation noise value) of the curve c is lower by about 1 dBμV/m. In this manner, it can be ascertained that this embodiment has a more excellent radiation noise suppressing effect.

When the flat cable is obliquely inserted in the above-described constitution, the capacitive circuit element of the capacitor-connection line which comes into erroneous contact with the power supply line works as high impedance in the case of a direct current, the direct current does not flow. As a result, it is possible to prevent damage to electronic equipment. The line adjacent to the power supply line in the flat cable works as a return channel in close vicinity to a noise component current which propagates through the power supply line and acts so as to effectively suppress the radiation noise from the flat cable.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2005-343050, filed Nov. 29, 2005, which is hereby incorporated by reference herein in its entirety.

What is claimed is:

1. A circuit connection structure, comprising:
   a flat cable on which a power supply line, ground lines and a signal line are formed, the ground lines being provided on both sides of the power supply line;
   a printed wiring board on which a power supply line, a ground line and a signal line are formed, the ground lines being provided on both sides of the power supply line; and
   a connector which is mounted on the printed wiring board and electrically connects the power supply line of the flat cable to the power supply line of the printed wiring board, the ground lines of the flat cable to the ground lines of the printed wiring board, and the signal line of the flat cable to the signal line of the printed wiring board,
   wherein the printed wiring board has a ground layer within the printed wiring board, and each of the ground lines of the printed wiring board is connected to the ground layer through the capacitive circuit element.

2. A printed circuit board, comprising:
   a printed wiring board on which a power line, ground lines and a signal line are formed, the ground lines being provided on both sides of the power supply line;
   a cable-connection connector which is mounted on the printed wiring board, and in case of the cable-connection connector connecting a cable, the power supply line, the ground lines and the signal line of the printed wiring board connecting a power supply line, ground lines and a signal line of the cable,
   wherein the printed wiring board has a ground layer within the printed wiring board, and each of the ground lines of the printed wiring board is connected to the ground layer trough the capacitive circuit element.

* * * * *